(12) United States Patent
Bhattacharjee et al.

(10) Patent No.: US 10,938,367 B2
(45) Date of Patent: Mar. 2, 2021

(54) SOLIDLY MOUNTED LAYER THIN FILM DEVICE WITH GROUNDING LAYER

(71) Applicant: Qorvo US, Inc., Greensboro, NC (US)

(72) Inventors: Kushal Bhattacharjee, Kernersville, NC (US); Sergei Zhgoon, Moscow (RU)

(73) Assignee: Qorvo US, Inc., Greensboro, NC (US)

( * ) Notice: Subject to any disclaimer, the term of this patent is extended or adjusted under 35 U.S.C. 154(b) by 721 days.

(21) Appl. No.: 15/623,856

(22) Filed: Jun. 15, 2017

(65) Prior Publication Data

US 2017/0288629 A1    Oct. 5, 2017

Related U.S. Application Data

(63) Continuation-in-part of application No. 15/087,277, filed on Mar. 31, 2016, now Pat. No. 10,326,426.
(Continued)

(51) Int. Cl.
*H03H 9/25* (2006.01)
*H03H 3/02* (2006.01)
(Continued)

(52) U.S. Cl.
CPC ............ *H03H 3/02* (2013.01); *H01L 41/053* (2013.01); *H03H 9/02015* (2013.01);
(Continued)

(58) Field of Classification Search
CPC .. H03H 3/02; H03H 9/02015; H03H 9/02118; H03H 9/02157; H03H 9/02228;
(Continued)

(56) References Cited

U.S. PATENT DOCUMENTS

| 4,952,904 A | 8/1990 | Johnson et al. |
| 7,262,676 B2 | 8/2007 | Ruile et al. |

(Continued)

FOREIGN PATENT DOCUMENTS

JP          6-104680 A   *   4/1994   ............. H03H 9/145

OTHER PUBLICATIONS

Author Unknown, "Acoustic Wave Sensors," Vectron International, Date Unknown, 44 pages, www.sengenuity.com/tech_ref/AWS_WebVersion.pdf.
(Continued)

*Primary Examiner* — Thomas M Dougherty
(74) *Attorney, Agent, or Firm* — Withrow & Terranova, P.L.L.C.

(57) ABSTRACT

An apparatus includes a substrate, a thin film piezoelectric layer, a transducer, and a low resistivity layer. The thin film piezoelectric layer is over the substrate, the transducer includes a number of electrodes in contact with the thin film piezoelectric layer and configured to transduce an acoustic wave in the thin film piezoelectric layer. The low resistivity layer is between at least a portion of the substrate and the thin film piezoelectric layer. By providing the low resistivity layer between at least a portion of the substrate and the thin film piezoelectric layer, a spurious response of the apparatus may be significantly reduced, thereby improving the performance thereof.

21 Claims, 14 Drawing Sheets

Related U.S. Application Data

(60) Provisional application No. 62/364,405, filed on Jul. 20, 2016.

(51) Int. Cl.
*H03H 9/02* (2006.01)
*H03H 9/17* (2006.01)
*H01L 41/053* (2006.01)
*H03H 9/64* (2006.01)
*H03H 9/15* (2006.01)

(52) U.S. Cl.
CPC .... *H03H 9/02118* (2013.01); *H03H 9/02157* (2013.01); *H03H 9/02228* (2013.01); *H03H 9/02275* (2013.01); *H03H 9/02574* (2013.01); *H03H 9/173* (2013.01); *H03H 9/64* (2013.01); *H03H 2003/021* (2013.01); *H03H 2009/155* (2013.01)

(58) Field of Classification Search
CPC ........... H03H 9/02275; H03H 9/02574; H03H 9/173; H03H 9/64; H03H 2003/021; H03H 2009/155; H01L 41/053
USPC .............................. 310/313 A–313 D, 313 R
See application file for complete search history.

(56) References Cited

U.S. PATENT DOCUMENTS

| | | |
|---|---|---|
| 7,586,239 B1 | 9/2009 | Li et al. |
| 7,898,158 B1 | 3/2011 | Li et al. |
| 2005/0250198 A1 | 11/2005 | Fujimura et al. |
| 2006/0076852 A1 | 4/2006 | Ruile et al. |
| 2009/0302715 A1* | 12/2009 | Shibata ............... H01L 41/1873 310/358 |
| 2010/0327995 A1 | 12/2010 | Reinhardt et al. |
| 2011/0109196 A1 | 5/2011 | Goto et al. |
| 2012/0198672 A1 | 8/2012 | Ueda et al. |
| 2013/0106243 A1 | 5/2013 | Reinhardt et al. |
| 2015/0225231 A1 | 8/2015 | Henn |
| 2015/0288345 A1 | 10/2015 | Bhattacharjee |
| 2016/0182007 A1 | 6/2016 | Bhattacharjee |
| 2016/0182009 A1 | 6/2016 | Bhattacharjee |
| 2017/0214381 A1 | 7/2017 | Bhattacharjee |
| 2017/0214382 A1 | 7/2017 | Bhattacharjee |
| 2017/0214383 A1 | 7/2017 | Bhattacharjee |
| 2017/0214384 A1 | 7/2017 | Bhattacharjee |
| 2017/0214385 A1 | 7/2017 | Bhattacharjee |
| 2018/0152171 A1* | 5/2018 | Kishimoto ............. H03H 9/145 |
| 2018/0159497 A1* | 6/2018 | Iwamoto ................. H03H 9/25 |

OTHER PUBLICATIONS

Author Unknown, "Single Crystals and Non-PZT Materials," APC International, Ltd., 2014, 2 pages, www.americanpiezo.com/product-service/custom-piezoelectric-elements/ceramic-crystals.html.

Campbell, Colin K., "An Overview of SAW Devices for Mobile/Wireless Communications," Understanding Surface Acoustic Wave (SAW) Devices for Mobile and Wireless Applications and Design Techniques, Session 19, 2008, 43 pages.

Ferrari, Vittorio et al., "Overview of Acoustic-Wave Microsensors," Piezoelectric Transducers and Applications, Springer-Verlag Berlin Heidelberg, 2008, pp. 39-62.

Hohmann, Siegfried et al., "Surface Acoustic Wave (SAW) Resonators for Monitoring Conditioning Film Formation," Sensors, vol. 15, May 21, 2015, pp. 11873-11888.

Kadota, Michio, et a., "Simulation of solidly mounted plate wave resonator with wide bandwidth using 0-th shear horizontal mode in LiNbO3 plate," Japanese Journal of Applied Physics, vol. 54, Jun. 2015, The Japanese Society of Applied Physics, 4 pages.

Lalinsky, T. et al., "AlGaN/GaN based SAW-HEMT structures for chemical gas sensors," Procedia Engineering, vol. 5, 2010, pp. 152-155.

Luong, Trung-Dung et al., "Surface Acoustic Wave Driven Microfluidics," Micro and Nanosystems, vol. 2, No. 3, 2010, 20 pages.

Shao, Lei, "Active Acoustic Emission from a Two-dimensional Electron Gas," Dissertation, University of Michigan, 2014, 103 pages.

Sherrit, Stewart et al., "BAW and SAW sensors for In-situ analysis," Proceedings of the SPIE Smart Structures Conference San Diego, CA, Mar. 2-6, 2003, Paper 5050-11, SPIE, 11 pages.

Wang, Wen et al., "Advances in SXFA-Coated SAW Chemical Sensors for Organophosphorous Compound Detection," Sensors, vol. 11, Jan. 2011, pp. 1526-1541.

Wong, King-Yuen et al., "Surface acoustic wave device on AlGaN/GaN heterostructure using two-dimensional electron gas interdigital transducers," Applied Physics Letters, vol. 90, No. 21, May 23, 2007, 3 pages.

Zhou, Changjian et al., "Temperature-Compensated High-Frequency Surface Acoustic Wave Device," IEEE Electron Device Letters, vol. 34, No. 12, Dec. 2013, pp. 1572-1574.

Non-Final Office Action for U.S. Appl. No. 15/087,277, dated Oct. 4, 2018, 11 pages.

Non-Final Office Action for U.S. Appl. No. 15/087,197, dated Oct. 29, 2018, 5 pages.

Non-Final Office Action for U.S. Appl. No. 15/087,354, dated Oct. 1, 2018, 12 pages.

Non-Final Office Action for U.S. Appl. No. 15/087,409, dated Oct. 1, 2018, 13 pages.

Notice of Allowance for U.S. Appl. No. 15/087,277, dated Feb. 5, 2019, 7 pages.

Notice of Allowance for U.S. Appl. No. 15/087,354, dated Jan. 18, 2019, 7 pages.

Notice of Allowance for U.S. Appl. No. 15/087,409, dated Jan. 22, 2019, 7 pages.

Ex Parte Quayle Action for U.S. Appl. No. 15/087,197, dated Mar. 22, 2019, 6 pages.

Notice of Allowance for U.S. Appl. No. 15/087,197, dated Aug. 26, 2019, 9 pages.

* cited by examiner

SOLIDLY MOUNTED LAYER THIN FILM DEVICE WITH GROUNDING LAYER

RELATED APPLICATIONS

This application claims the benefit of provisional patent application Ser. No. 62/364,405, filed Jul. 20, 2016, the disclosure of which is hereby incorporated herein by reference in its entirety. This application is a continuation-in-part of U.S. patent application Ser. No. 15/087,277, filed Mar. 31, 2016, now U.S. Pat. No. 10,326,426, the disclosure of which is hereby incorporated herein by reference in its entirety.

FIELD OF THE DISCLOSURE

The present disclosure relates to acoustic wave devices, and in particular to acoustic wave devices configured to operate in a lateral wave mode.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of RF signals for communication. For purposes of illustration, FIG. 1 shows details of a conventional SAW resonator 10. The conventional SAW resonator 10 includes a piezoelectric layer 12, an interdigital transducer 14 on a surface of the piezoelectric layer 12, a first reflector structure 16A on the surface of the piezoelectric layer 12 adjacent to the interdigital transducer 14, and a second reflector structure 16B on the surface of the piezoelectric layer 12 adjacent to the interdigital transducer 14 opposite the first reflector structure 16A.

The interdigital transducer 14 includes a first interdigital electrode 18A and a second interdigital electrode 18B, each of which include a number of fingers 20 that are interleaved with one another as shown. A distance between adjacent fingers 20 of the first interdigital electrode 18A and the second interdigital electrode 18B defines an electrode period P of the interdigital transducer 14. A ratio of the width of the adjacent fingers 20 of the first interdigital electrode 18A and the second interdigital electrode 18B and electrode period P defines a metallization ratio M of the interdigital transducer 14. The electrode period P and the metallization ratio M together characterize the interdigital transducer 14 and may determine one or more operational parameters of the conventional SAW resonator 10. For example, the electrode period P and the metallization ratio M of the interdigital transducer 14, along with other factors such as the properties of the piezoelectric layer 12 may determine a resonant frequency of the device.

In operation, an alternating electrical input signal provided at the first interdigital electrode 18A is transduced into a mechanical signal in the piezoelectric layer 12, resulting in one or more acoustic waves therein. In the case of the conventional SAW device 10, the resulting acoustic waves are predominately surface acoustic waves. As discussed above, due to the electrode period P and the metallization ratio M of the interdigital transducer 14, the characteristics of the material of the piezoelectric layer 12, and other factors, the magnitude and frequency of the acoustic waves transduced in the piezoelectric layer 12 are dependent on the frequency of the alternating electrical input signal. This frequency dependence is often described in terms of changes in the impedance and/or a phase shift between the first interdigital electrode 18A and the second interdigital electrode 18B with respect to the frequency of the alternating electrical input signal. The acoustic waves transduced by the alternating electrical input signal travel in the piezoelectric layer 12, eventually reaching the second interdigital electrode 18B where they are transduced into an alternating electrical output signal. The first reflector structure 16A and the second reflector structure 16B reflect the acoustic waves in the piezoelectric layer 12 back towards the interdigital electrode 14 to confine the acoustic waves in the area surrounding the interdigital transducer 14.

FIG. 2 is a graph illustrating an ideal relationship of the impedance (shown as admittance) between the first interdigital electrode 18A and the second interdigital electrode 18B to the frequency of the alternating electrical input signal for the conventional SAW resonator 10. A solid line 22 illustrates the admittance between the first interdigital electrode 18A and the second interdigital electrode 18B with respect to the frequency of the alternating electrical input signal. Notably, the solid line 22 includes a peak at a first point at which the admittance between the first interdigital electrode 18A and the second interdigital electrode 18B climbs rapidly to a maximum value. This peak occurs at the series resonant frequency ($f_s$) of the conventional SAW resonator 10. The impedance between the first interdigital electrode 18A and the second interdigital electrode 18B at the series resonant frequency is minimal, such that the first interdigital electrode 18A and the second interdigital electrode 18B appear as a short-circuit. The solid line 22 also includes a valley at a second point at which the admittance between the first interdigital electrode 18A and the second interdigital electrode 18B plummets rapidly to a minimum value. This valley occurs at the parallel resonant frequency ($f_p$) of the conventional SAW resonator 10. The impedance between the first interdigital electrode 18A and the second interdigital electrode 18B at the parallel resonant frequency is at a maximum, such that the first interdigital electrode 18A and the second interdigital electrode 18B appear as an open circuit.

While the series resonant frequency and the parallel resonant frequency of the conventional SAW resonator 10 are shown occurring at certain frequencies in the graph, various aspects of the conventional SAW resonator 10, such as the electrode period P and the metallization ratio M of the interdigital transducer 14, the material of the piezoelectric layer 12, and other factors may be modified to raise or lower both the series resonant frequency and the parallel resonant frequency. However, the frequency of the conventional SAW resonator 10 is generally limited due to limits in the velocity of acoustic waves in the piezoelectric layer 12. This in turn limits the utility of the conventional SAW resonator 10, precluding its use in applications requiring processing of high frequency signals above a certain threshold. Further, there are limits in the frequency delta achievable between SAW devices such as the conventional SAW resonator 10 fabricated on the same wafer, such that multi-frequency SAW devices generally must be on different wafers that consume more space in a device.

The graph shown in FIG. 2 is highly idealized. In reality, the response of the conventional SAW resonator 10 includes spurious areas that degrade the performance thereof. There have been numerous developments in the technology in an effort to suppress these spurious responses, however, due to limitations posed by the relatively thick piezoelectric layer 12 discussed above, it may be difficult to reduce the spurious response of the conventional SAW resonator 10 to a desirable level, especially at high frequencies.

SUMMARY

In one embodiment, an apparatus includes a substrate, a thin film piezoelectric layer, a transducer, and a low resistivity layer. The thin film piezoelectric layer is over the substrate, the transducer includes a number of electrodes in contact with the thin film piezoelectric layer and configured to transduce an acoustic wave in the thin film piezoelectric layer. The low resistivity layer is between at least a portion of the substrate and the thin film piezoelectric layer. By providing the low resistivity layer between at least a portion of the substrate and the thin film piezoelectric layer, a spurious response of the apparatus may be significantly reduced, thereby improving the performance thereof.

In one embodiment, the transducer is configured to transduce a lateral acoustic wave in the thin film piezoelectric layer. A resistivity of the low resistivity layer may be less than $1 \times 10^{-2}$ Ω·cm, and a resistivity of the substrate may be greater than $1 \times 10^{-1}$ Ω·cm. Providing the low resistivity layer may effectively shield the thin film piezoelectric layer from the relatively high resistance of the substrate, which may suppress a spurious response of the apparatus and thus improve the performance thereof.

In one embodiment, the substrate is one of silicon, glass, ceramic, and the like. The thin film piezoelectric layer may be one of lithium niobate, lithium tantalate, and the like. The low resistivity layer may be a metal and/or metal alloy layer such as copper, titanium, and the like, or may be a highly doped silicon layer.

In one embodiment, the low resistivity layer is a blanket layer between the entirety of the substrate and the thin film piezoelectric layer. In another embodiment, the transducer comprises an active region and a passive region, and the low resistivity layer is provided only under the active region of the transducer.

In one embodiment, the apparatus further includes a guided wave confinement layer between the low resistivity layer and the substrate. The guiding wave confinement layer may include alternating layers of low impedance layers and high impedance layers.

In one embodiment, a method includes the steps of providing a substrate, providing a thin film piezoelectric layer over the substrate, providing a transducer in contact with the thin film piezoelectric layer, and providing a low resistivity layer between at least a portion of the substrate and the thin film piezoelectric layer. The transducer includes a number of electrodes in contact with the thin film piezoelectric layer and configured to transduce an acoustic wave in the thin film piezoelectric layer. By providing the low resistivity layer between at least a portion of the substrate and the thin film piezoelectric layer, a spurious response of the apparatus may be significantly reduced, thereby improving the performance thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
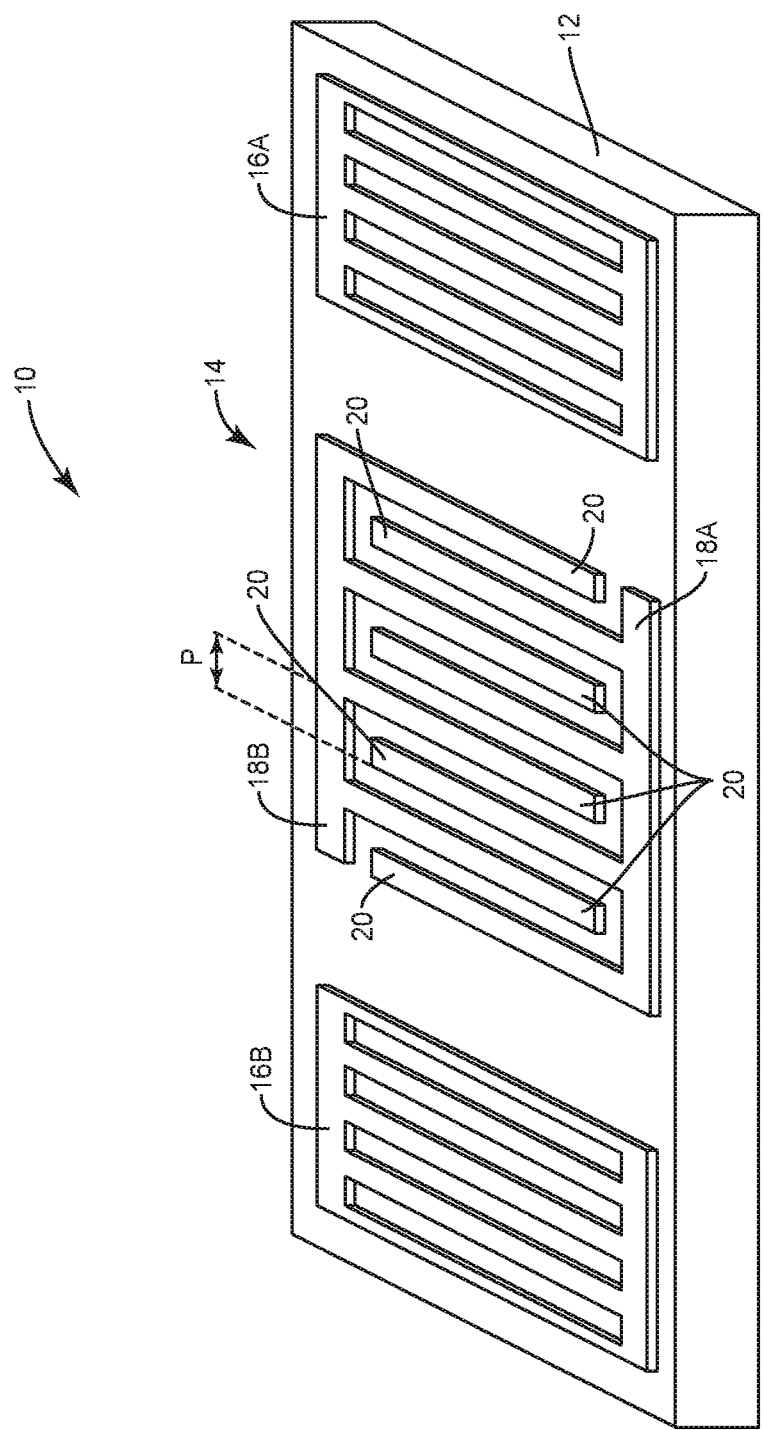
FIG. 1 illustrates a conventional surface acoustic wave (SAW) resonator.
Figure 2:
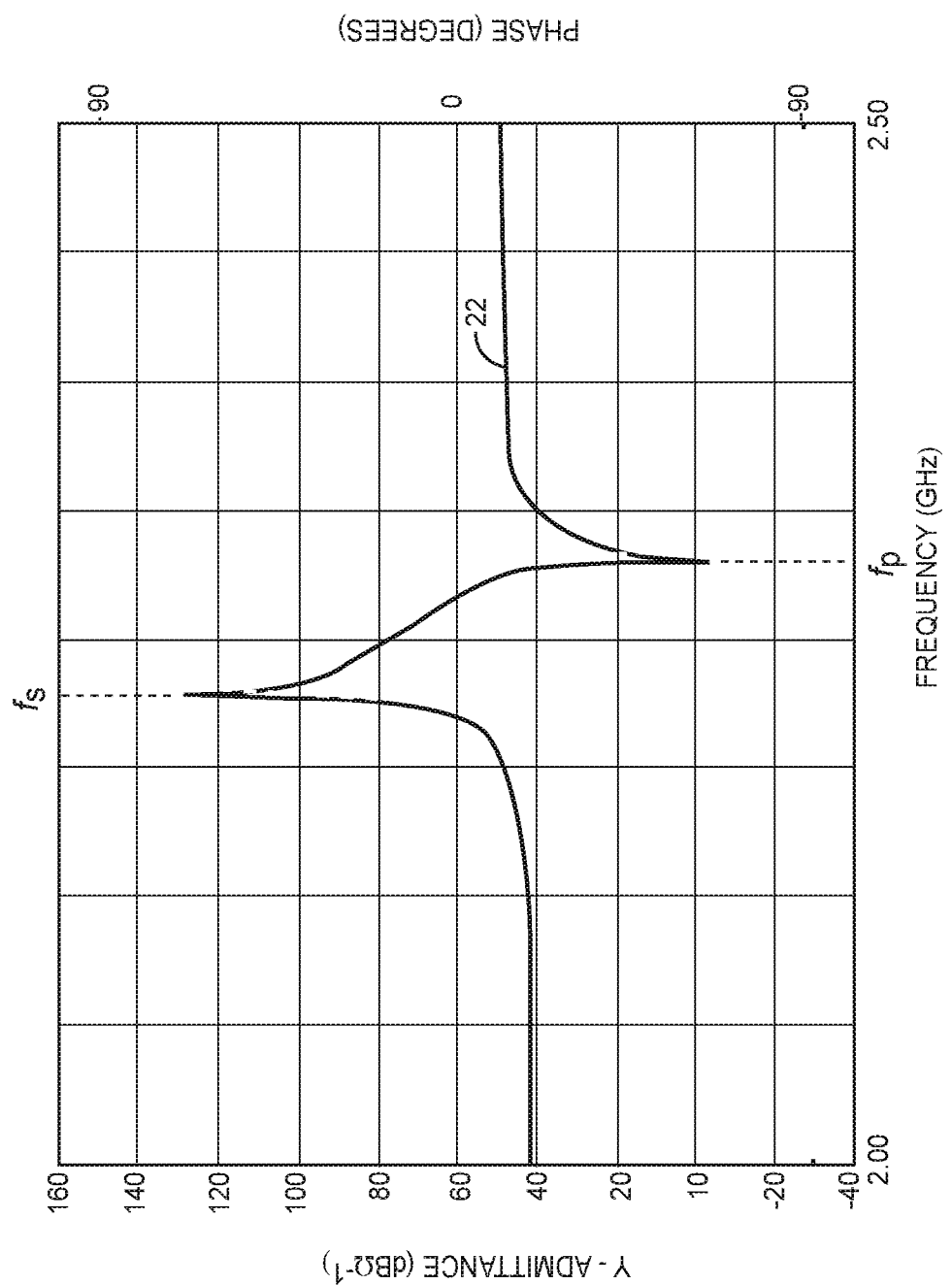
FIG. 2 is a graph illustrating a relationship of impedance of a conventional SAW resonator to frequency.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
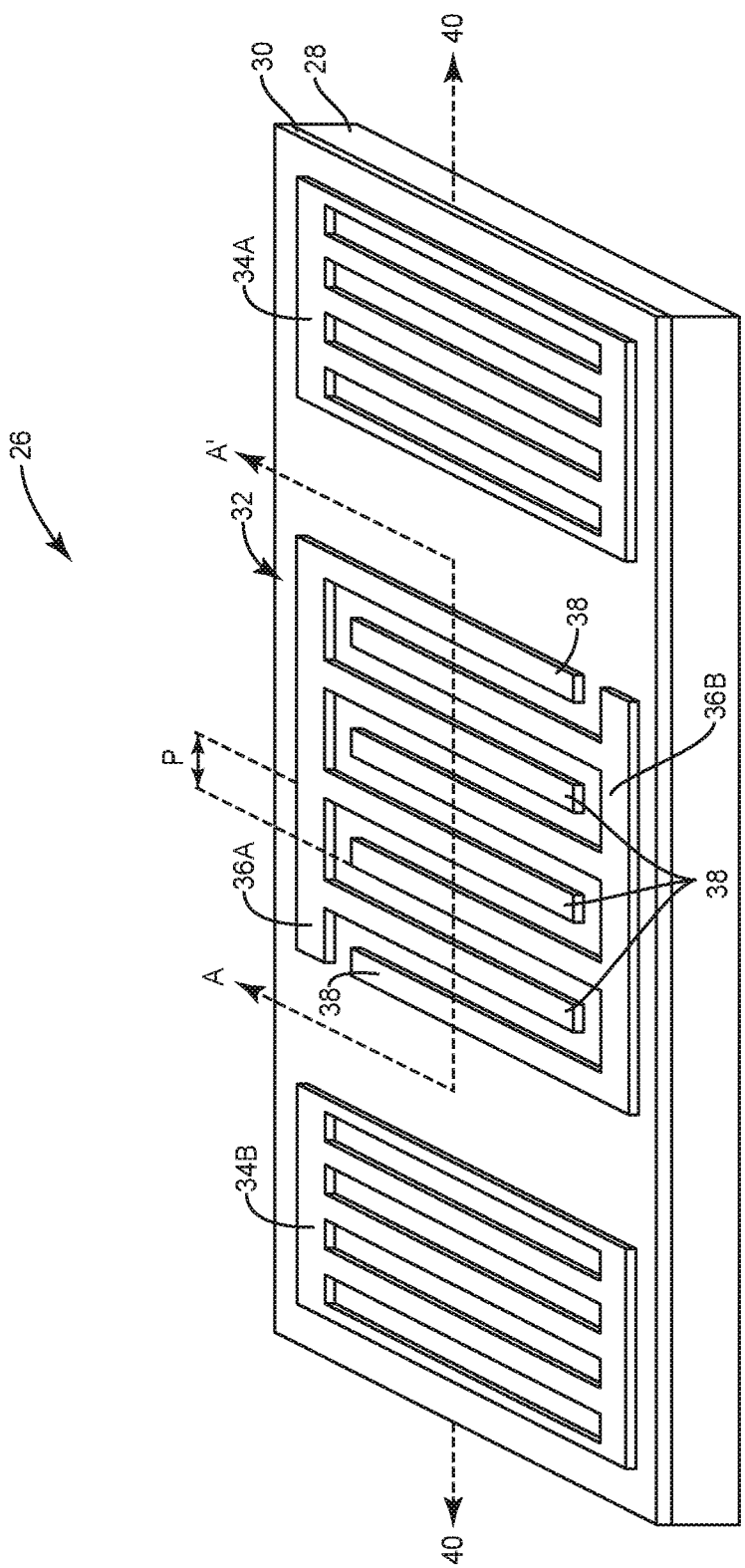
FIG. 3 illustrates an acoustic wave device according to one embodiment of the present disclosure.

FIG. 3 shows an acoustic wave device 26 according to one embodiment of the present disclosure. The acoustic wave device 26 includes a substrate 28, a thin film piezoelectric layer 30 on the substrate 28, an interdigital transducer 32 on a surface of the thin film piezoelectric layer 30 opposite the substrate 28, a first reflector structure 34A on the surface of the thin film piezoelectric layer 30 adjacent to the interdigital transducer 32, and a second reflector structure 34B on the surface of the thin film piezoelectric layer 30 adjacent to the interdigital transducer 32 opposite the first reflector structure 34A. The acoustic wave device 26 may be referred to as a "solidly mounted layer" thin film device, due to the nature of the mounting of the thin film piezoelectric layer 30 to the substrate 28.

The interdigital transducer 32 includes a first interdigital electrode 36A and a second interdigital electrode 36B, each of which include a number of fingers 38 that are interleaved with one another as shown. A distance between adjacent fingers 38 of the first interdigital electrode 36A and the second interdigital electrode 36B defines an electrode period P of the interdigital transducer 32. A ratio of the width of the electrode fingers 38 of the first interdigital electrode 36A and the second interdigital electrode 36B and the electrode period P defines a metallization ratio M of the interdigital transducer 32. The electrode period P and the metallization ratio M together characterize the interdigital transducer 32 and may determine one or more operational parameters of the acoustic wave device 26. For example, the electrode period P and the metallization ratio M together characterize the interdigital transducer 32, and along with other factors such as the properties of the thin film piezoelectric layer 30 may determine a resonant frequency of the device.

The structure of the acoustic wave device 26 shown in FIG. 3 is similar to the conventional surface acoustic wave (SAW) resonator 10 discussed above with respect to FIG. 1, except that the piezoelectric layer in the acoustic wave device 26 is a thin film layer deposited on a substrate, rather than a relatively thick standalone layer. As discussed above, the relatively thick conventional piezoelectric layer has a limited velocity for the transmission of surface acoustic waves therein. The thin film piezoelectric layer 30 does not suffer from these same limitations, thereby allowing the acoustic wave device 26 to be used at much higher frequencies than the conventional SAW resonator 10, and, as discussed below, with improved performance. Further, the flexibility in the manufacture of the acoustic wave device 26 is substantially increased, as many manufacturing processes currently exist for providing thin film piezoelectric layer 30 in a relatively inexpensive manner while maintaining a very high quality thereof.

In various embodiments, the substrate 28 may be silicon, glass, ceramic, and the like, and have a thickness between 5 and 1000 um. The thin film piezoelectric layer 30 may be lithium niobate, lithium tantalate, quartz, piezoceramic, or a deposited piezoelectric material such as aluminum nitride or zinc oxide and have a thickness between $\frac{1}{100}$ and 1 wavelength at central frequency (or of the IDT period). The thickness of the thin film piezoelectric layer 30 may be dependent on a wavelength of a desired acoustic wave in the device, such that the thickness is between approximately 1% and 100% of a desired wavelength of the device. The thin film piezoelectric layer 30 may be a single crystal material in order to increase quality factor, stability, electromechanical coupling coefficient, and repeatability while reducing loss and motional impedance. Further, the thin film piezoelectric layer 30 may be provided as a nonstandard (e.g., offcut) crystalline orientation of the single crystal piezoelectric material to provide specific vibrational characteristics, such as low temperature coefficient of frequency, high electromechanical coupling coefficient, or both. Since it is extremely difficult to grow single crystal piezoelectric material (e.g., via epitaxy) over non-lattice-matched materials, the thin film piezoelectric layer 30 may be pre-fabricated (e.g., by growth of a boule followed by formation of thin wafers), surface finished (e.g., via chemical mechanical planarization (CMP) and polishing to provide near-atomic flatness), and bonded to one or more underlying layers such as the substrate 28. Any suitable wafer bonding technique known in the art may be used to bond the thin film piezoelectric layer 30 to the one or more underlying layers, including those relying on van der Waals bonds, hydrogen bonds, covalent bonds, and/or mechanical interlocking. Further, direct bonding may be used. The bonding may include one or more surface activation steps (e.g., plasma treatment, chemical treatment, and/or other treatment methods) followed by application of heat and/or pressure, optionally followed by one or more annealing steps. Such bonding results in formation of a bonded interface between the thin film piezoelectric layer 30 and an underlying layer such as the substrate 28, which may include at least one intervening layer arranged on at least a portion of (or the entirety of) a surface of the substrate 28.

In operation, an alternating electrical input signal provided at the first interdigital electrode 36A is transduced into a mechanical signal in the thin film piezoelectric layer 30, resulting in one or more acoustic waves therein. In the case of the acoustic wave device 26, the resulting acoustic waves are predominately lateral waves, which propagate parallel to a horizontal axis 40 of the device. This is due to the nature of the thin film piezoelectric layer 30 and the design of the interdigital transducer 32. As discussed above, due to the electrode period P and the metallization ratio M of the interdigital transducer 32, the characteristics of the material of the thin film piezoelectric layer 30, and other factors, the magnitude and frequency of the acoustic waves transduced in the thin film piezoelectric layer 30 are dependent on the frequency of the alternating electrical input signal. This frequency dependence is often described in terms of changes in the impedance and/or a phase shift between the first interdigital electrode 36A and the second interdigital electrode 36B with respect to the frequency of the alternating electrical input signal. The acoustic waves transduced by the alternating electrical input signal travel in the thin film piezoelectric layer 30, eventually reaching the second interdigital electrode 36B where they are transduced into an alternating electrical output signal. The substrate 28 substantially confines the acoustic waves to the thin film piezoelectric layer 30. Further, the first reflector structure 34A and the second reflector structure 34B reflect the acoustic waves in the thin film piezoelectric layer 30 back towards the interdigital transducer 32 to confine the acoustic waves in the area surrounding the interdigital transducer 32.

Notably, the configuration of the interdigital transducer 32, the first reflector structure 34A, and the second reflector structure 34B shown in FIG. 3 is merely exemplary. Those skilled in the art will appreciate that different configurations of transducers (e.g., periodically-poled transducers, multiple transducers, etc.) suitable for transducing a lateral acoustic wave in the thin film piezoelectric layer may be used along with different configurations of reflector structures without departing from the principles of the present disclosure. In general, any number of different electrodes and reflector structures may be provided on the surface of the thin film piezoelectric layer 30 to create an acoustic wave device predominately operating in a lateral acoustic wave mode, all of which are contemplated herein.

Figure 4:
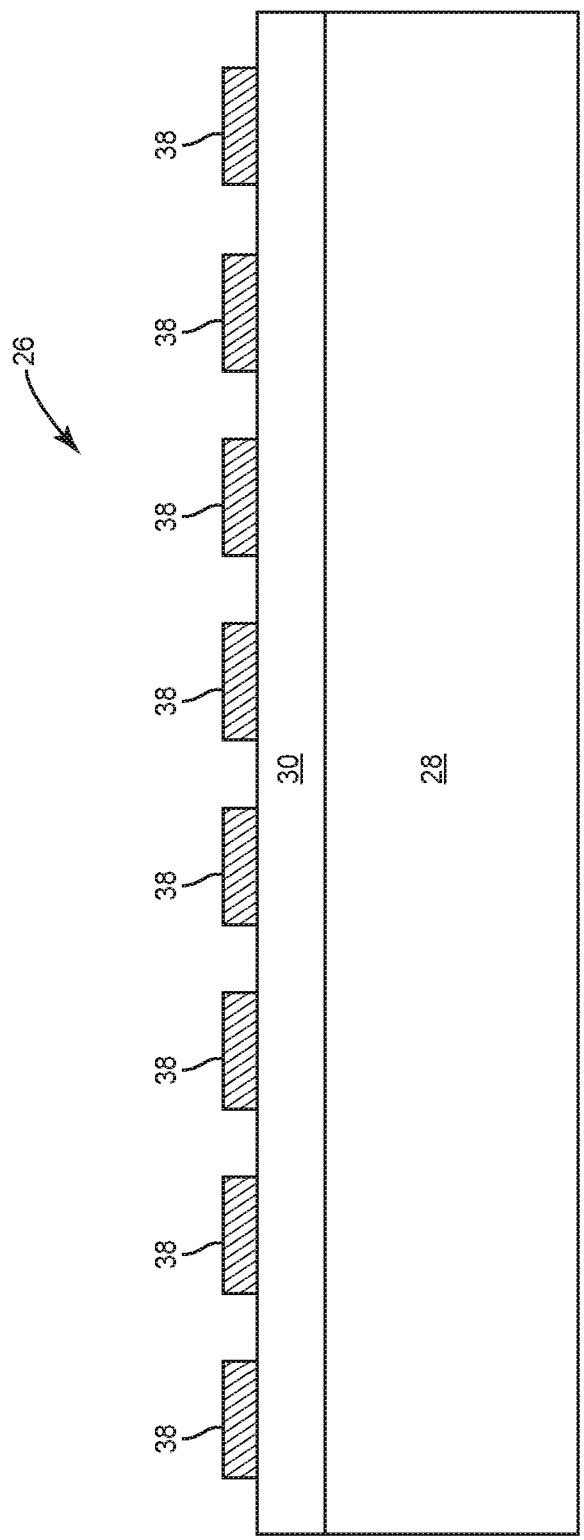
FIG. 4 illustrates a cross-section of an acoustic wave device according to one embodiment of the present disclosure.
Figure 5:
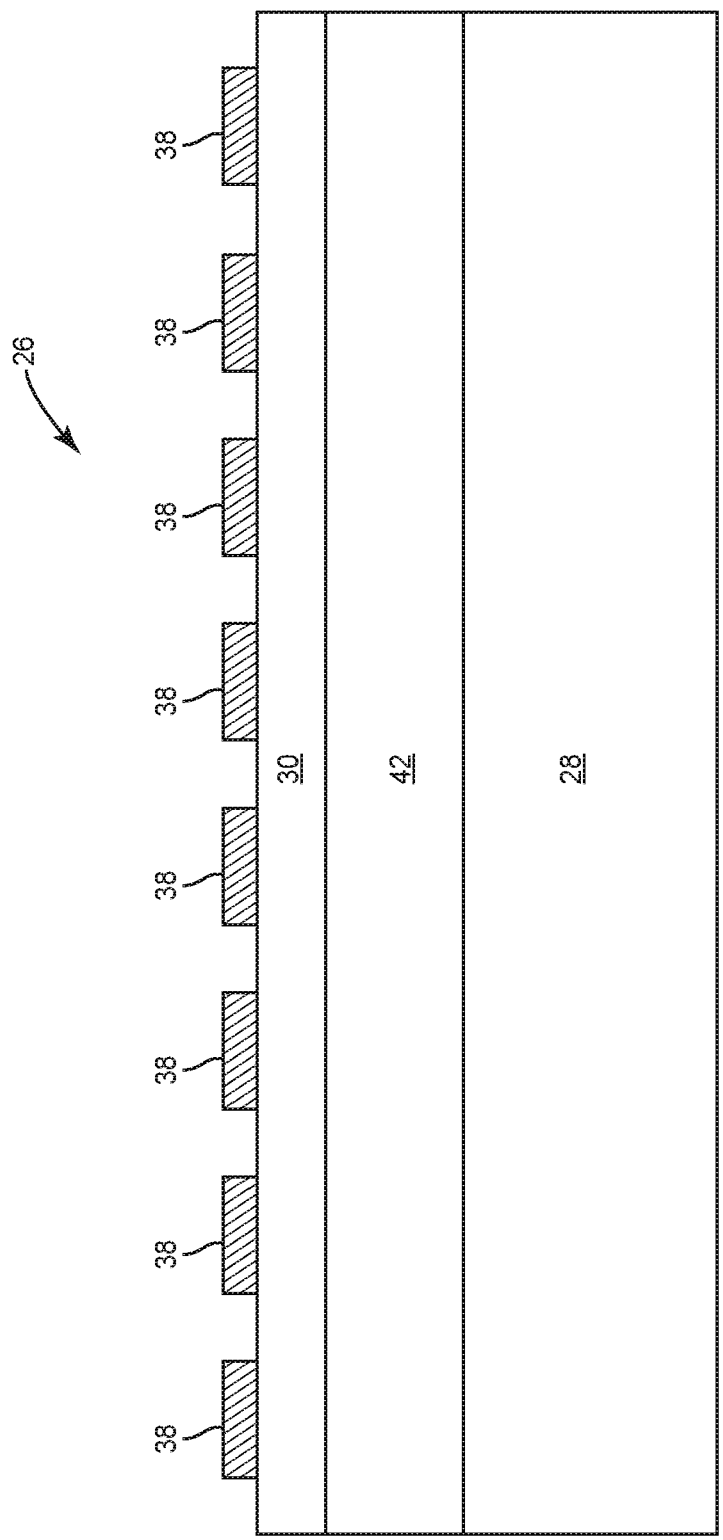
FIG. 5 illustrates a cross-section of an acoustic wave device according to one embodiment of the present disclosure.

FIG. 4 is a cross-section of the acoustic wave device 26 through line A-A' shown in FIG. 3. As illustrated, the thin film piezoelectric layer 30 is on the substrate 28, and the fingers 38 of the first interdigital electrode 36A and the second interdigital electrode 36B are on the surface of the thin film piezoelectric layer 30 opposite the substrate 28. In some embodiments, one or more additional layers may be located between the substrate 28 and the thin film piezoelectric layer 30. For example, FIG. 5 illustrates an additional layer 42 between the substrate 28 and the thin film piezoelectric layer 30. The additional layer 42 may be, for example, a slow wave propagation layer, which is defined herein as a layer in which an acoustic wave of interest travels more slowly than in a proximate piezoelectric layer in which the acoustic wave is transduced. Examples of materials used for such a slow wave propagation layer include silicon dioxide. In some embodiments, the additional layer 42 may comprise multiple sub-layers such as any number of alternating slow wave propagation layers and fast wave propagation layers, which are defined herein as layers in which an acoustic wave of interest travels more quickly than in a proximate piezoelectric layer in which the acoustic wave is transduced. The additional layer 42 may be provided to change one or more operating parameters of the acoustic wave device 26. For example, the additional layer 42 may be provided to increase the confinement of acoustic waves transduced in the thin film piezoelectric layer 30 therein, to increase thermal performance, increase mechanical coupling coefficient, reduce thermal loss, and the like. In various embodiments, the thickness of the additional layer 42 may be between $\frac{1}{100}$ and 1 wavelength of a central frequency (or of the IDT period).

Figure 6:
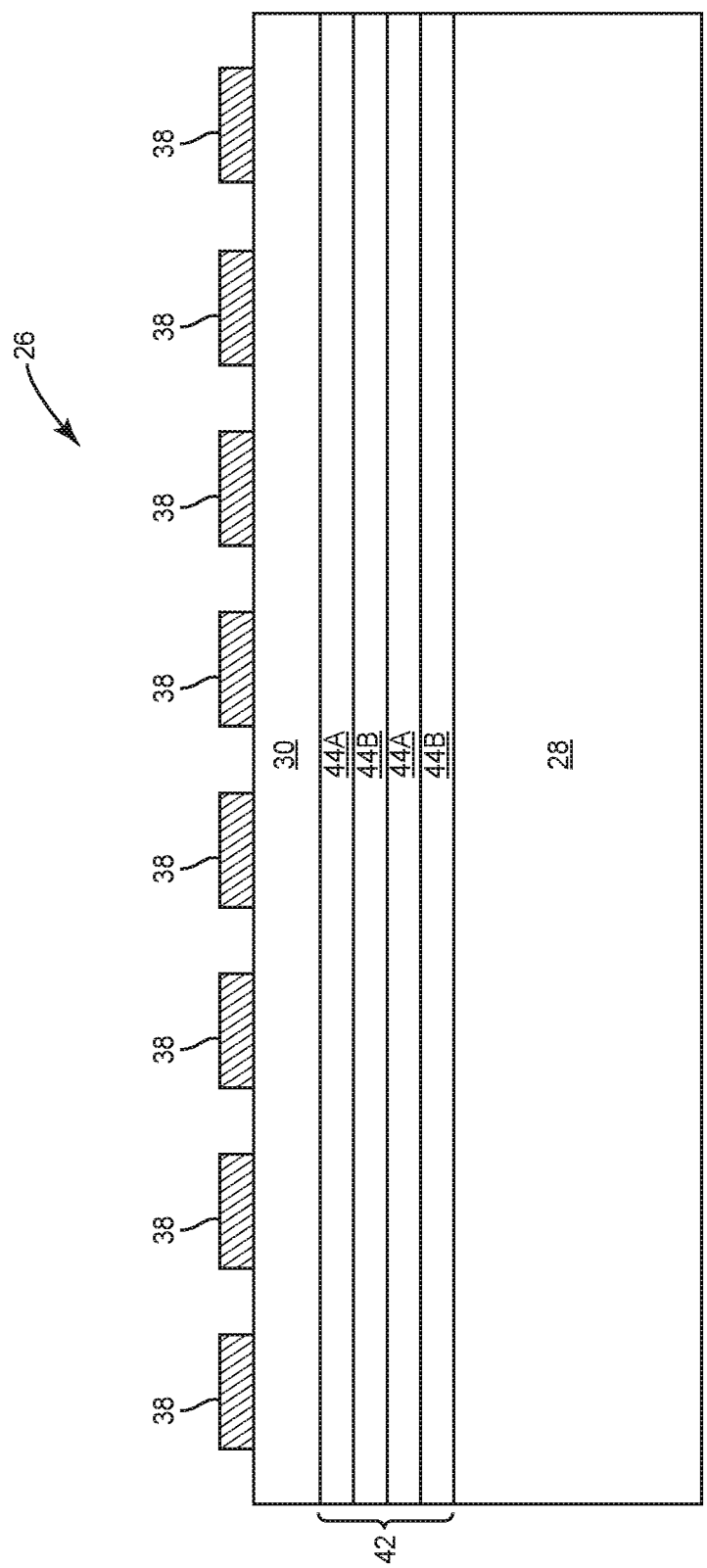
FIG. 6 illustrates a cross-section of an acoustic wave device according to one embodiment of the present disclosure.

In certain embodiments, the additional layer 42 may comprise a Bragg mirror, as illustrated in FIG. 6, such that the additional layer 42 comprises multiple sub-layers 44. The sub-layers 44 may alternate between low impedance layers 44A (e.g., silicon dioxide) and high impedance layers 44B (e.g., tungsten or hafnium dioxide). The number of sub-layers 44 provided may depend on the total reflection coefficient desired from the additional layer 42. Those skilled in the art will appreciate that the Bragg mirror will substantially confine acoustic waves such as lateral waves in the thin film piezoelectric layer 30. In some embodiments, the additional layer 42 may comprise both a slow wave propagation layer and the Bragg mirror.

Figure 7:
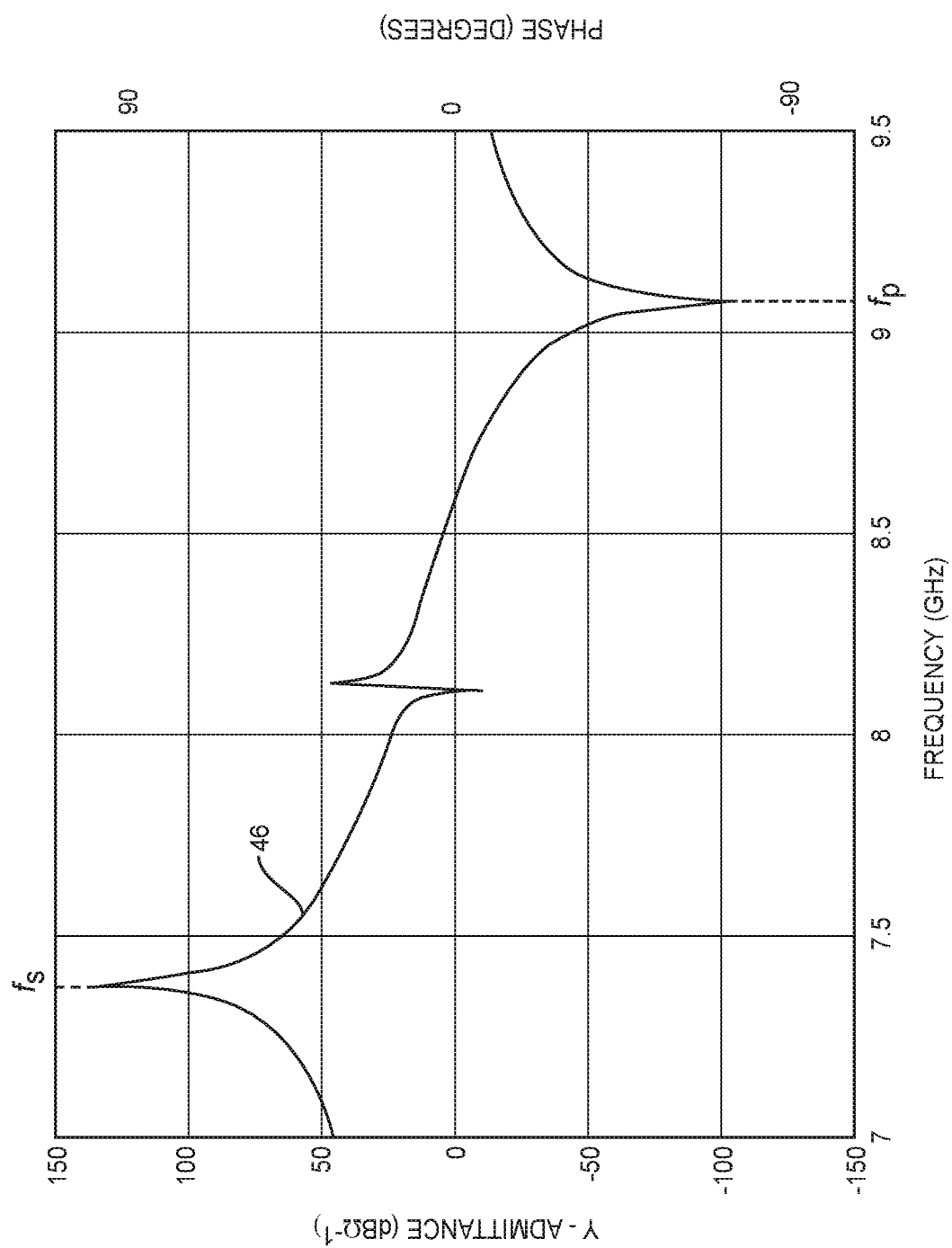
FIG. 7 is a graph illustrating a relationship of impedance to frequency of an acoustic wave device according to one embodiment of the present disclosure.

FIG. 7 is a graph illustrating a relationship of the impedance (shown as admittance between the first interdigital electrode 36A and the second interdigital electrode 36B to the frequency of the alternating electrical input signal for the acoustic wave device 26. A solid line 46 illustrates the admittance between the first interdigital electrode 36A and the second interdigital electrode 36B with respect to the frequency of the alternating electrical input signal. Notably, the solid line 46 includes a peak at a first point at which the admittance between the first interdigital electrode 36A and the second interdigital electrode 36B climbs rapidly to a maximum value. This peak occurs at the series resonant frequency ($f_s$) of the acoustic wave device 26. The impedance between the first interdigital electrode 36A and the second interdigital electrode 36B at the series resonant frequency is minimal, such that the first interdigital electrode 36A and the second interdigital electrode 36B appear as a short-circuit. The solid line 46 also includes a valley at a second point at which the admittance between the first interdigital electrode 36A and the second interdigital electrode 36B plummets to a minimum value. This valley occurs at the parallel resonant frequency ($f_p$) of the acoustic wave device 26. The impedance between the first interdigital electrode 36A and the second interdigital electrode 36B at the parallel resonant frequency is at a maximum, such that the first interdigital electrode 36A and the second interdigital electrode 36B appear as an open circuit.

Notably, the series resonant frequency and the parallel resonant frequency occur at substantially higher frequencies than that of the conventional SAW resonator, due to the advantages of utilizing the thin film piezoelectric layer 30 discussed above. Various aspects of the acoustic wave device 26, such as the electrode period P and the metallization ratio M of the interdigital transducer 32, the material and cut orientation of the thin film piezoelectric layer 30, additional layers 42 between the substrate 28 and the thin film piezoelectric layer 30, and the like may be modified to raise or lower both the resonant and parallel resonant frequency. In various embodiments, the series resonant frequency of the acoustic wave device may be between 0.1 GHz and 10 GHz.

As shown in FIG. 7, there is a significant spurious response in the admittance of the acoustic wave device 26 between the series resonant frequency and the parallel resonant frequency. This spurious response may degrade the performance of the acoustic wave device 26 in some scenarios, and thus it is desirable to minimize such a response. The inventors of the present disclosure discovered that interactions between the thin film piezoelectric layer 30 and the substrate 28, which has a relatively high resistivity (e.g., a resistivity greater than $1.0 \times 10^{-1}$ Ω·cm for a silicon substrate) may at least partially cause the spurious response discussed above. By providing a low resistivity layer between the substrate 28 and the thin film piezoelectric layer 30 to "shield" the thin film piezoelectric layer 30 and the interdigital transducer 32 from the high resistivity substrate 28, the spurious response may be reduced and/or eliminated. As discussed herein, a low resistivity layer is a layer with a resistivity less than $50 \times 10^{-8}$ Ω·cm. The low resistivity layer may be electrically disconnected (i.e., "floating") or connected to a constant potential such as ground.

Figure 8:
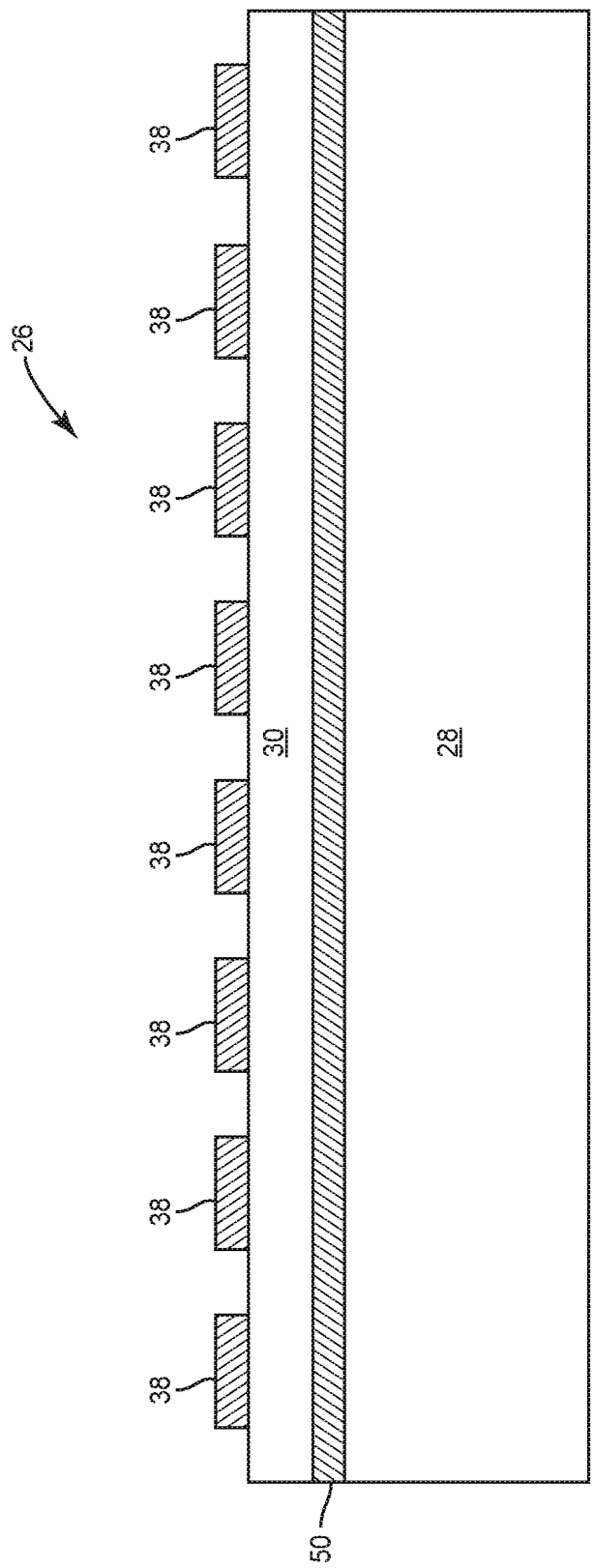
FIG. 8 illustrates a cross-section of an acoustic wave device according to one embodiment of the present disclosure.

FIG. 8 shows a cross-section of the acoustic wave device 26 including a low resistivity layer 50 for the suppression of spurious responses according to one embodiment of the present disclosure. The low resistivity layer 50 is provided on at least a portion of the substrate 28 such that it is located between the substrate 28 and the thin film piezoelectric layer 30. In some embodiments, the low resistivity layer 50 may have a resistivity less than 1×Ω·cm and comprise a metal or metal alloy such as silver, copper, aluminum, tungsten, iron, platinum, and the like. The resistivity of the low resistivity layer 50 may be much lower in some circumstances, for example, less than $50 \times 10^{-8}$ Ω·cm. The low resistivity layer 50 may be provided as a blanket layer over the entirety of the substrate 28, or only on select portions of the substrate 28 as discussed in detail below. In other embodiments, the low resistivity layer 50 may be formed by highly doping or implanting the surface of the substrate 28 facing the thin film piezoelectric layer 30 such that the resistivity thereof is significantly lowered to a level below $1 \times 10^{-2}$ Ω·cm. Said doping or implantation may be provided in a blanket fashion or only in selective areas as discussed above. The low resistivity layer 50 effectively "shields" the thin film piezoelectric layer 30 and the interdigital transducer 32 from the substrate 28, which as discussed above has a high resistivity that may contribute to a spurious response of the acoustic wave device 26. Accordingly, the performance of the acoustic wave device 26 may be significantly improved.

The low resistivity layer 50 may have a thickness between 10 and 10000 nm. Further, the low resistivity layer 50 may be a "floating" layer that is not directly coupled to an electric potential, or a portion of the low resistivity layer 50 may be exposed such that the low resistivity layer 50 is connected to a constant potential such as ground.

Figure 9:
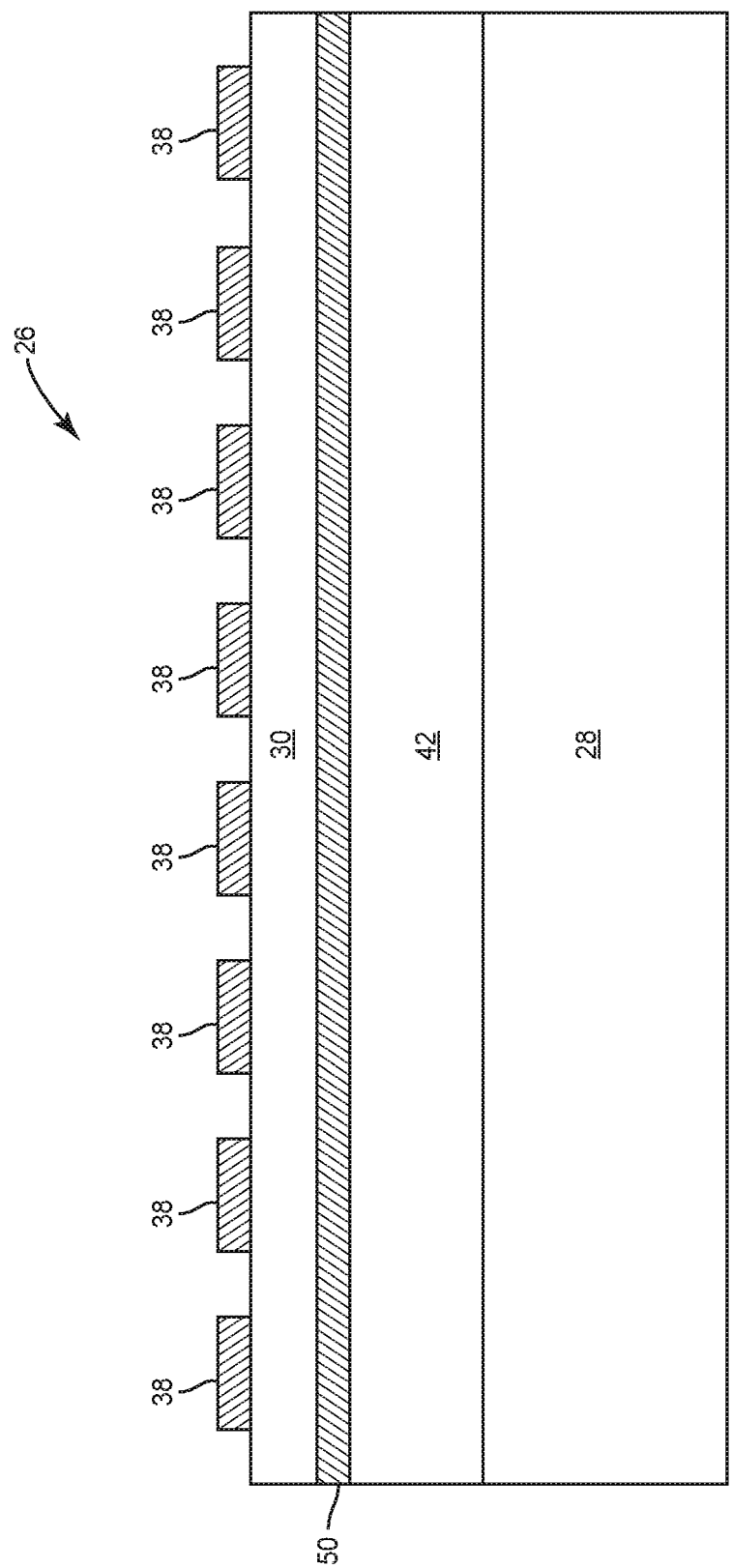
FIG. 9 illustrates a cross-section of an acoustic wave device according to one embodiment of the present disclosure.

FIG. 9 shows a cross-section of the acoustic wave device 26 including the low resistivity layer 50 according to an additional embodiment of the present disclosure. The acoustic wave device 26 shown in FIG. 9 is substantially similar to that shown in FIG. 8, except that the additional layer 42 is provided between the low resistivity layer 50 and the substrate 28. As discussed above, the additional layer may be a slow wave propagation layer, alternating slow wave and fast wave propagation layers, or a Bragg mirror.

Figure 10:
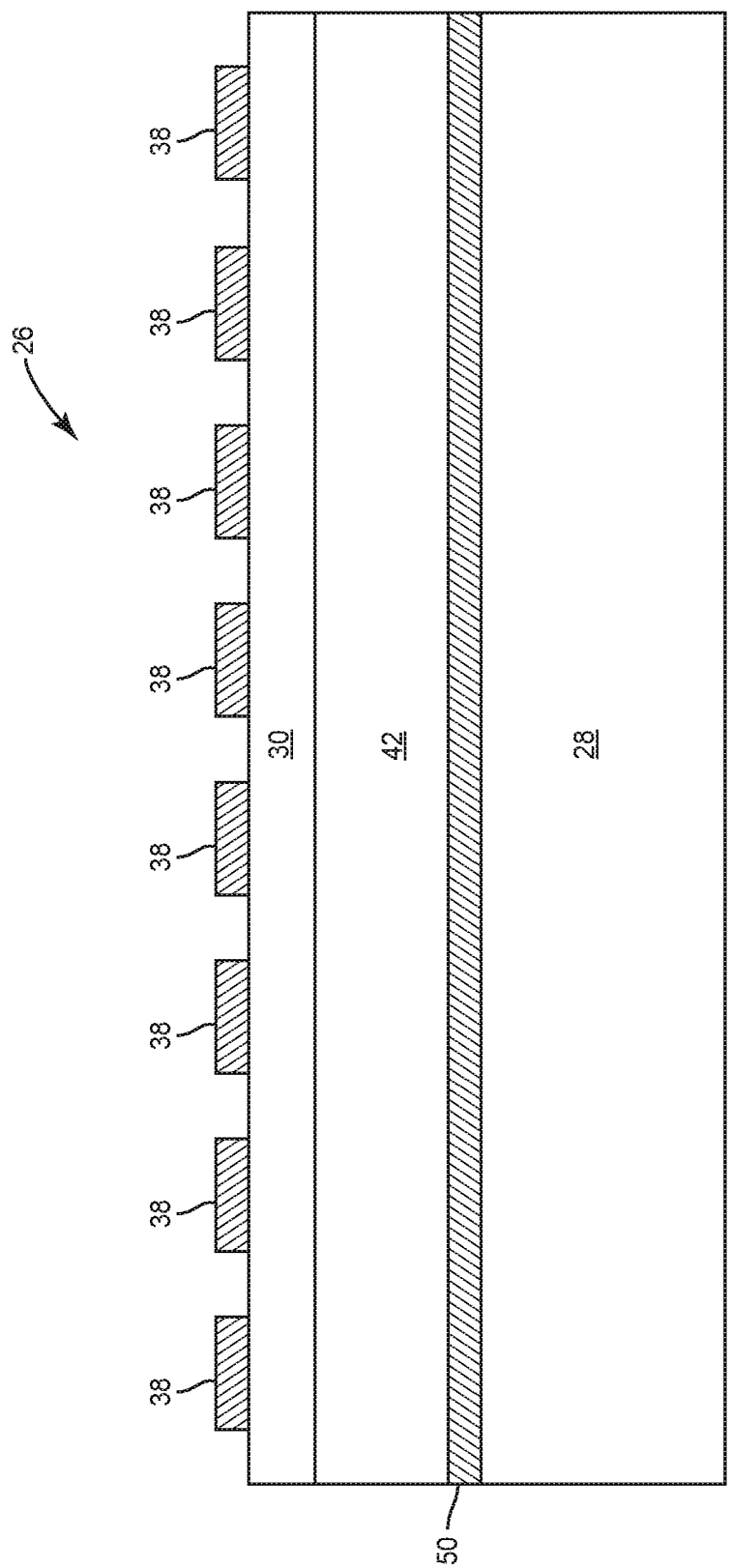
FIG. 10 illustrates a cross-section of an acoustic wave device according to one embodiment of the present disclosure.

FIG. 10 shows a cross-section of the acoustic wave device 26 including the low resistivity layer 50 according to an additional embodiment of the present disclosure. The acoustic wave device 26 shown in FIG. 10 is substantially similar to that shown in FIG. 9, except that the location of the low resistivity layer 50 is changed such that the low resistivity layer 50 is provided between the substrate 28 and the additional layer 42.

Figure 11:
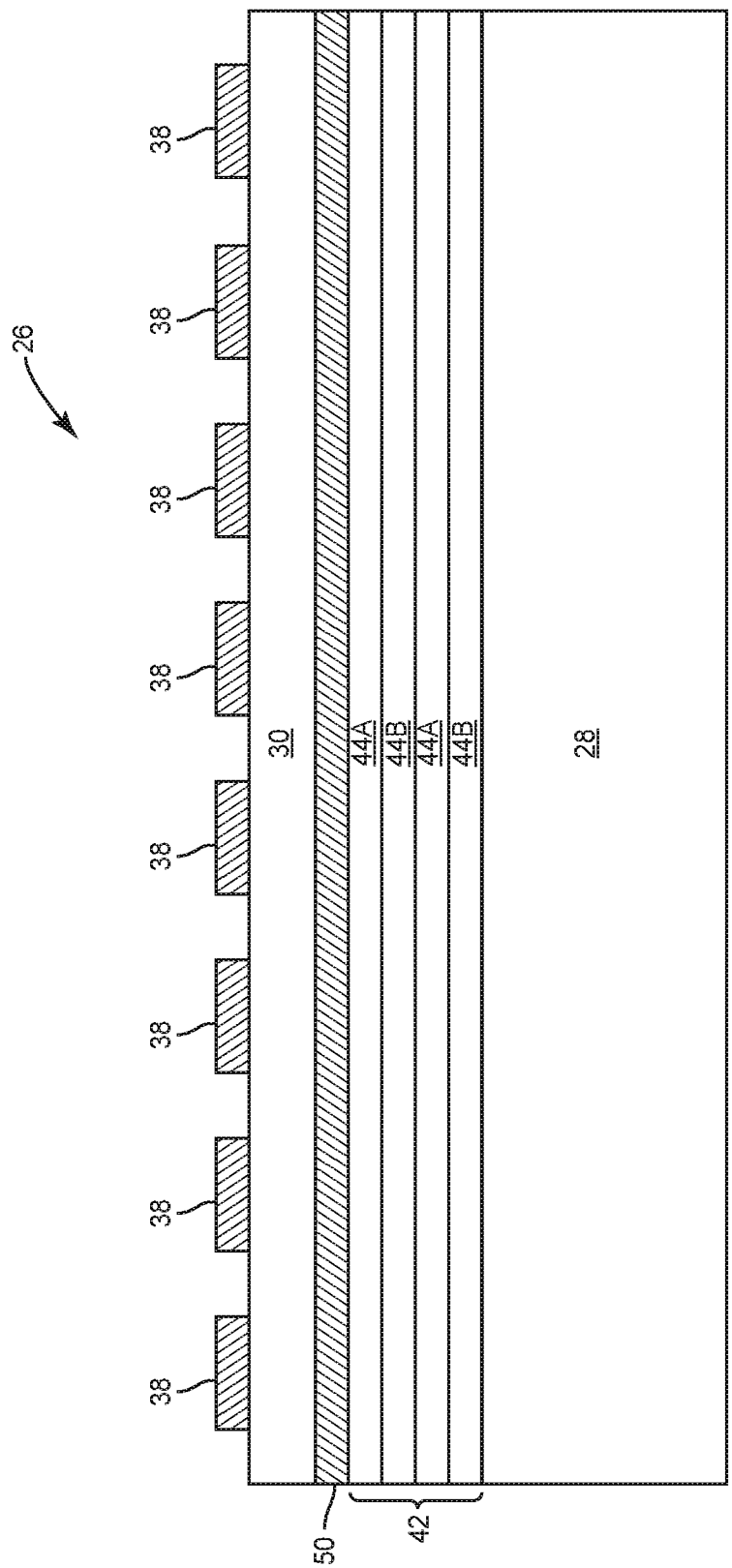
FIG. 11 illustrates a cross-section of an acoustic wave device according to one embodiment of the present disclosure.

FIG. 11 shows a cross-section of the acoustic wave device 26 including the low resistivity layer 50 according to an additional embodiment of the present disclosure. The acoustic wave device 26 shown in FIG. 11 is substantially similar to that shown in FIG. 9, except that the additional layer 42 is shown as a Bragg mirror comprising the alternating low impedance layers 44A and high impedance layers 44B as discussed above.

Figure 12:
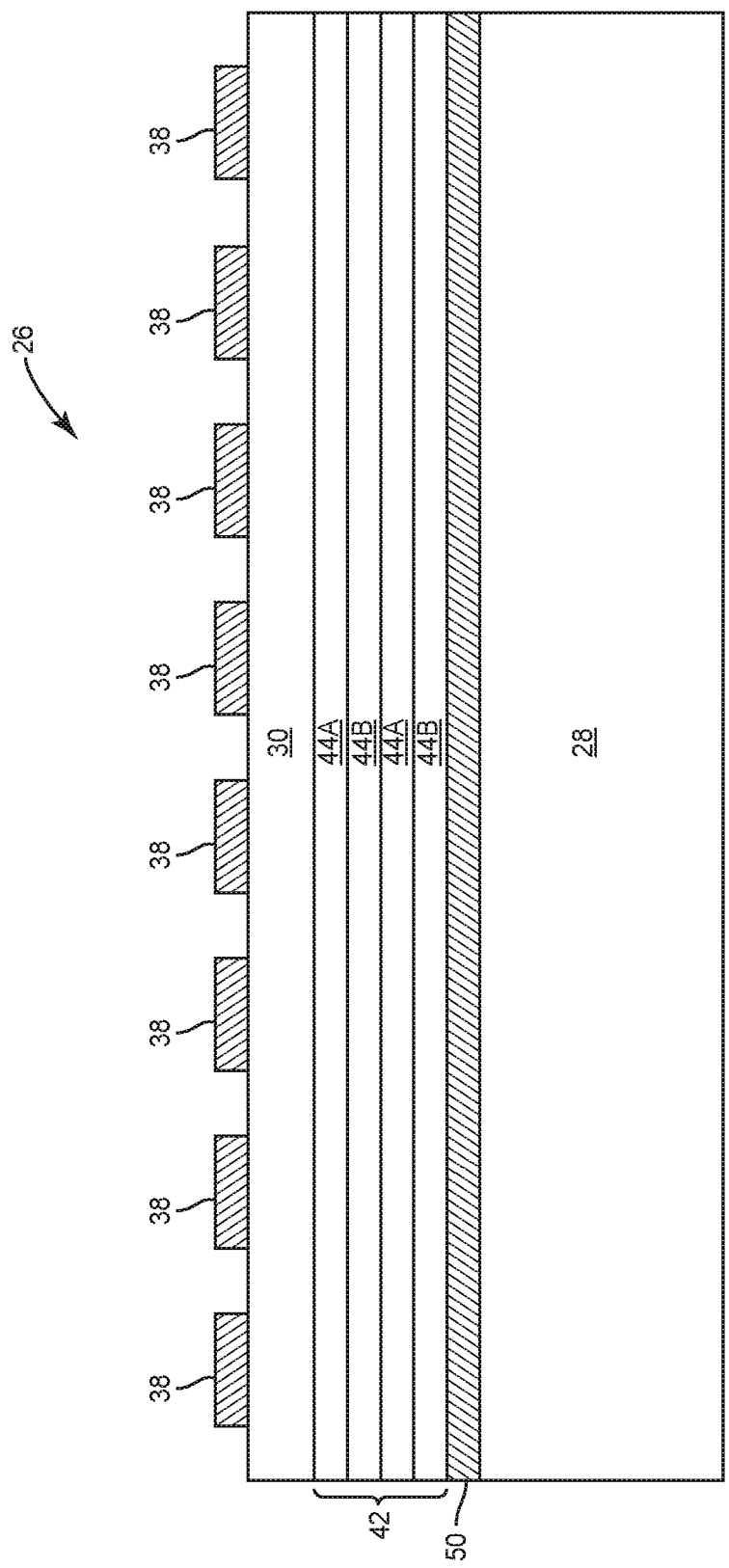
FIG. 12 illustrates a cross-section of an acoustic wave device according to one embodiment of the present disclosure.

FIG. 12 shows a cross-section of the acoustic wave device 26 according to an additional embodiment of the present disclosure. The acoustic wave device 26 shown in FIG. 12 is substantially similar to that shown in FIG. 11, except that the location of the low resistivity layer 50 is changed such that the low resistivity layer 50 is provided between the substrate 28 and the additional layer 42, which is a Bragg mirror.

Figure 13:
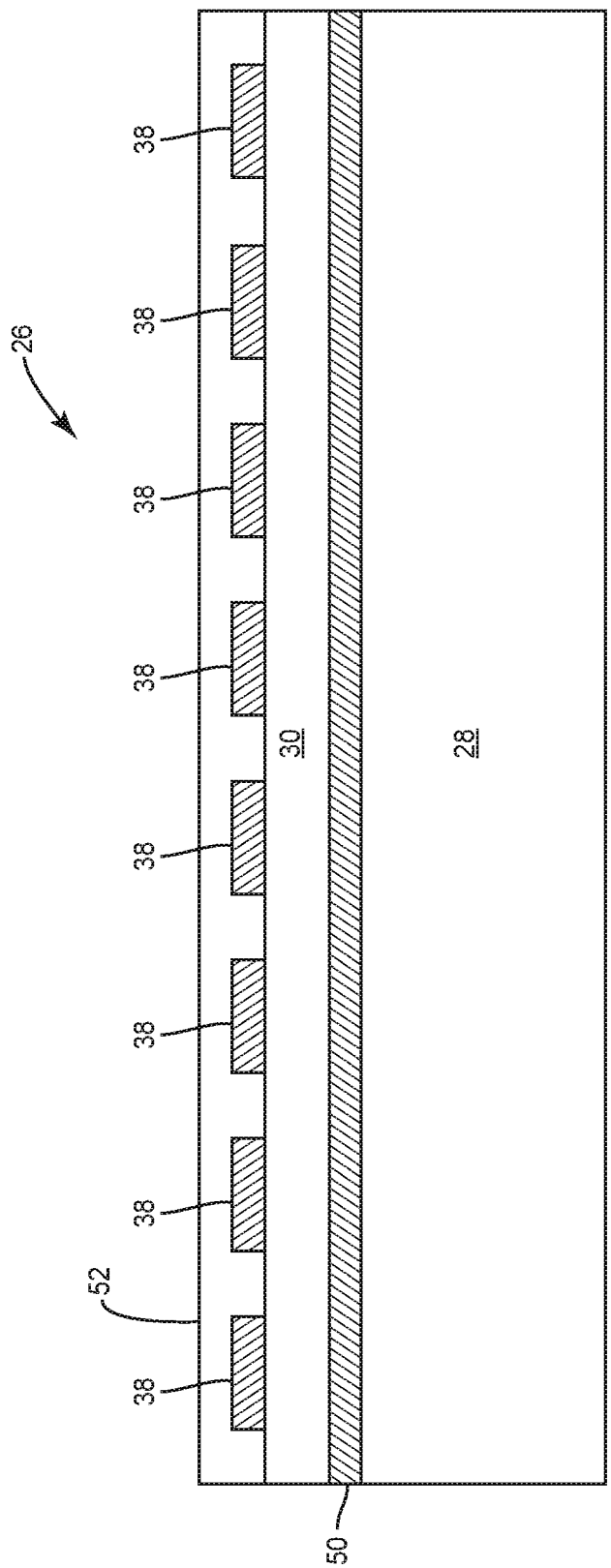
FIG. 13 illustrates a cross-section of an acoustic wave device according to one embodiment of the present disclosure.

FIG. 13 shows a cross-section of the acoustic wave device 26 according to an additional embodiment of the present disclosure. The acoustic wave device 26 shown in FIG. 13 is substantially similar to that shown in FIG. 8 but further includes a functional layer 52 over the surface of the thin film piezoelectric layer 30 opposite the substrate 28, the interdigital transducer 32, the first reflector structure 34A, and the second reflector structure 34B. The functional layer 52 may be provided to enhance certain characteristics of the acoustic wave device 26, such as thermal efficiency, coupling coefficient, and the like. In various embodiments, the functional layer 52 may be silicon dioxide or the like. Additional functional layers such as those detailed in U.S. Pat. No. 10,326,426, the contents of which are incorporated herein in their entirety, may be provided over the functional layer 52 to further enhance one or more characteristics of the acoustic wave device 26.

Figure 14:
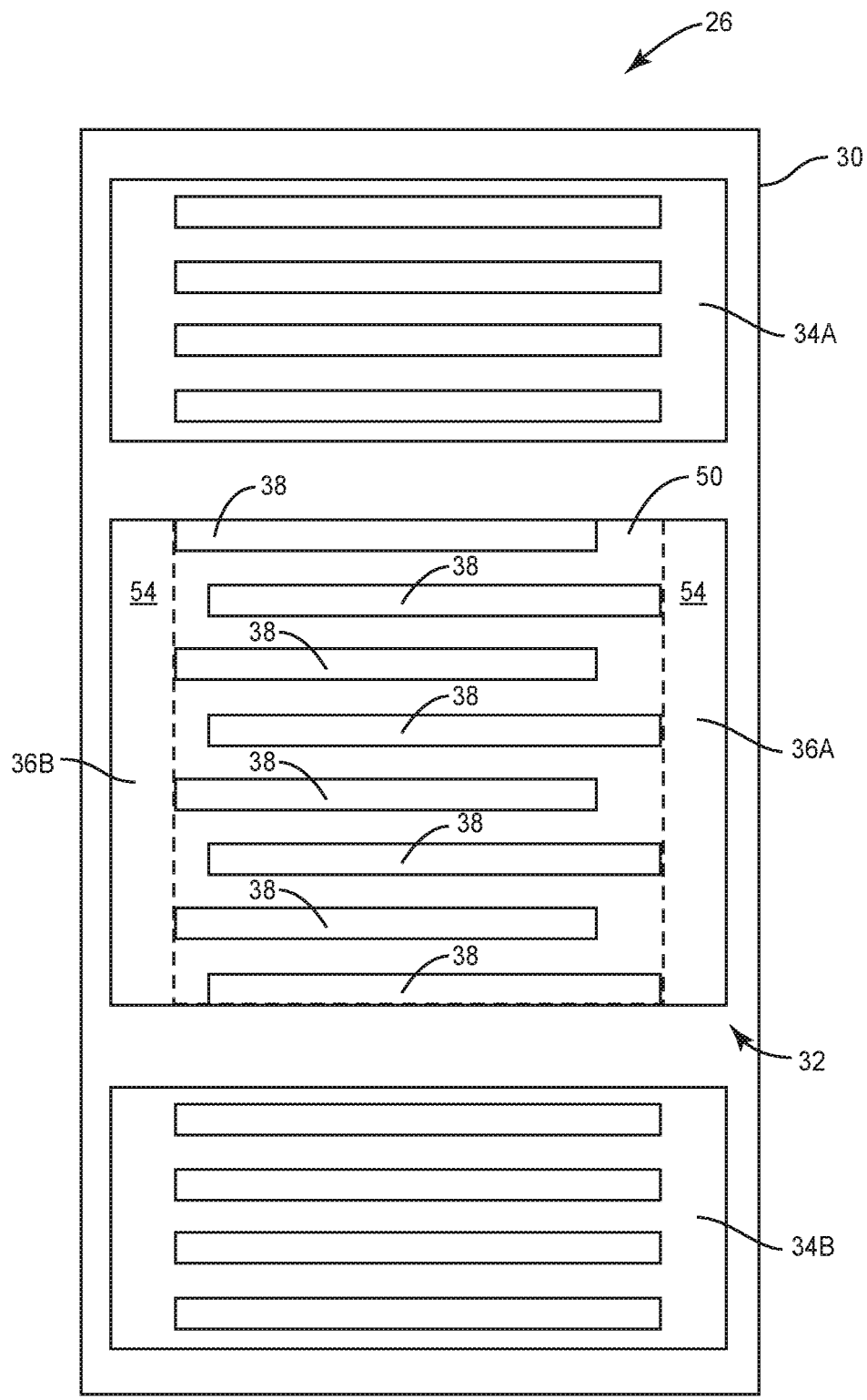
FIG. 14 illustrates a top view of an acoustic wave device according to one embodiment of the present disclosure.

FIG. 14 is a top view of the acoustic wave device 26 according to one embodiment of the present disclosure. As discussed above, the low resistivity layer 50 may be provided as a blanket layer between the entirety of the substrate 28 and the thin film piezoelectric layer 30, or may be selectively provided only between portions thereof. FIG. 14 illustrates a first configuration for the low resistivity layer 50 where it is provided only below an active portion of the interdigital transducer 32. Those skilled in the art will appreciate that the active portion of the interdigital transducer 32 includes the area directly under the fingers 38 thereof, but not including side rails 54 from which the fingers 38 extend. However, in some embodiments, the low resistivity layer 50 may also be provided under the side rails 54 of the interdigital transducer 32. Notably, the configuration shown in FIG. 14 is merely exemplary. In various embodiments, the low resistivity layer 50 may be provided between any portion of the substrate 28 and the thin film piezoelectric layer 30, and further may be broken up into multiple discrete sections that are provided between different portions of the substrate 28 and the thin film piezoelectric layer 30.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a substrate;
a thin film piezoelectric layer over the substrate;
a transducer comprising a plurality of electrodes in contact with the thin film piezoelectric layer and configured to transduce a lateral acoustic wave in the thin film piezoelectric layer; and
a low resistivity layer between at least a portion of the substrate and the thin film piezoelectric layer and electrically connected to ground.

2. The apparatus of claim 1 wherein a resistivity of the low resistivity layer is less than $1\times10^{-2}$ Ω·cm.

3. The apparatus of claim 2 wherein a resistivity of the substrate is greater than $1\times10^{-1}$ Ω·cm.

4. The apparatus of claim 3 wherein:
the substrate comprises one of silicon, glass, and ceramic;
the thin film piezoelectric layer comprises one of lithium niobate and lithium tantalate; and
the low resistivity layer comprises one of copper, titanium, and highly doped silicon.

5. The apparatus of claim 3 wherein the low resistivity layer is a blanket layer between the entirety of the substrate and the thin film piezoelectric layer.

6. The apparatus of claim 3 wherein the transducer comprises an active region and a passive region, and the low resistivity layer is provided only under the active region of the transducer.

7. The apparatus of claim 3 further comprising a guided wave confinement layer between the low resistivity layer and the substrate.

8. The apparatus of claim 7 wherein the guided wave confinement layer comprises a plurality of alternating low impedance layers and high impedance layers.

9. The apparatus of claim 3 further comprising a guided wave confinement layer between the thin film piezoelectric layer and the low resistivity layer.

10. The apparatus of claim 9 wherein the guided wave confinement layer comprises a plurality of alternating low impedance layers and high impedance layers.

11. The apparatus of claim 1 wherein the substrate comprises one of silicon, glass, and ceramic.

12. The apparatus of claim 1 wherein the low resistivity layer is a blanket layer between the entirety of the substrate and the thin film piezoelectric layer.

13. The apparatus of claim 1 wherein the transducer comprises an active region and a passive region, and the low resistivity layer is provided only under the active region of the transducer.

14. The apparatus of claim 1 further comprising a guided wave confinement layer between the low resistivity layer and the substrate.

15. The apparatus of claim 14 wherein the guided wave confinement layer comprises a plurality of alternating low impedance layers and high impedance layers.

16. The apparatus of claim 1 further comprising a guided wave confinement layer between the thin film piezoelectric layer and the low resistivity layer.

17. The apparatus of claim 16 wherein the guided wave confinement layer comprises a plurality of alternating low impedance layers and high impedance layers.

18. The apparatus of claim 1 further comprising a functional layer over at least a portion of the transducer.

19. A method comprising:
providing a substrate;
providing a thin film piezoelectric layer over the substrate;
providing a transducer in contact with the thin film piezoelectric layer, the transducer comprising a plurality of electrodes in contact with the thin film piezoelectric layer and configured to transduce a lateral acoustic wave in the thin film piezoelectric layer; and
providing a low resistivity layer between at least a portion of the substrate and the thin film piezoelectric layer and connected to ground.

20. The method of claim 19 wherein:
a resistivity of the low resistivity layer is less than $1\times10^{-2}$ Ω·cm; and
a resistivity of the substrate is greater than $1\times10^{-1}$ Ω·cm.

21. The method of claim 19 wherein providing the low resistivity layer between at least a portion of the substrate and the thin film piezoelectric layer comprises implanting a dopant in a surface of the substrate nearest the thin film piezoelectric layer.

* * * * *